US006337580B2

(12) United States Patent
Muramatsu (10) Patent No.: US 6,337,580 B2
(45) Date of Patent: *Jan. 8, 2002

(54) SEMICONDUCTOR INTEGRATED CIRCUIT HAVING TRANSISTORS FOR CUTTING-OFF SUBTHRESHOLD CURRENT (75) Inventor: Yoshinori Muramatsu, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/288,090

(22) Filed: Apr. 8, 1999

(30) Foreign Application Priority Data

Apr. 15, 1998 (JP) .......................... 10-105117

(51) Int. Cl.[7] .......................................... H03K 19/0175
(52) U.S. Cl. ............................ 326/83; 326/17; 326/119
(58) Field of Search ............................ 326/83, 17, 119, 326/121

(56) References Cited

U.S. PATENT DOCUMENTS 5,583,457 A * 12/1996 Horiguchi et al. .......... 326/121
5,726,946 A * 3/1998 Yamagata et al. .......... 365/226
5,751,651 A * 5/1998 Ooishi ........................ 365/226

FOREIGN PATENT DOCUMENTS

| JP | 5-210976 | 8/1993 |
| JP | 8-83487 | 3/1996 |

OTHER PUBLICATIONS

Kitsukawa, et. al., "256–Mb DRAM Circuit Technologies for File Applications", IEEE Journal of Solid–State Circuits, vol. 28, No. 11, Nov. 1993, pp. 1105–1111.

* cited by examiner

Primary Examiner—Michael Tokar
Assistant Examiner—Anh Q. Tran
(74) Attorney, Agent, or Firm—McGinn & Gibb, PLLC (57) ABSTRACT

A semiconductor integrated circuit which enables a subthreshold current to be suppressed when a logic gate circuit group is nonactivated and enables the logic gate circuit group to be activated at a high speed is provided. The semiconductor integrated circuit has at least one logic gate circuit connected to a feed line, a first transistor serially connected to the feed line in order to suppress the subthreshold current flowing in the logic gate circuit upon nonactivation of the logic gate circuit and a second transistor which is connected in parallel to the first transistor. The second transistor is activated prior to activation of the logic gate circuit and the first transistor.

17 Claims, 6 Drawing Sheets

PRIOR ART

Fig.6

SEMICONDUCTOR INTEGRATED CIRCUIT HAVING TRANSISTORS FOR CUTTING-OFF SUBTHRESHOLD CURRENT

BACKGROUND OF THE INVENTION

1. Field of the Invention

The present invention relates to a semiconductor integrated circuit, and more particularly, to a semiconductor integrated circuit in which transistors for cutting-off a subthreshold current are added to feed lines and/or grounding lines which supply electrical potential to a logic gate circuit group in driving circuits of a semiconductor memory device.

2. Description of the Related Art

In the conventional semiconductor integrated circuit, in accordance with forming a minute semiconductor element, a subthreshold current flowing when the element is turned off is a problem. The subthreshold current is a current which flows even when the element is turned off. If the subthreshold current is left as it is, an erroneous operation of the circuit or the like is caused.

For example, in a word driver of a semiconductor memory devices, a gate circuit having a large driving power is used to drive a word line, and an influence of the subthreshold current is large so that a problem such that a consumption of a current is increased is caused.

In order to solve the problem caused by the subthreshold current, as disclosed in IEEEJ. Solid-State Circuit, vol. 28, No. 11, p.1105, November 1993, for instance, it is proposed that a transistor for cutting-off the subthreshold current is serially inserted to a feed line for applying a voltage to the semiconductor device element.

The conventional semiconductor integrated circuit to which the transistor for cutting-off the subthreshold current is added will now be described with reference to FIG. 5.

Figure 5:
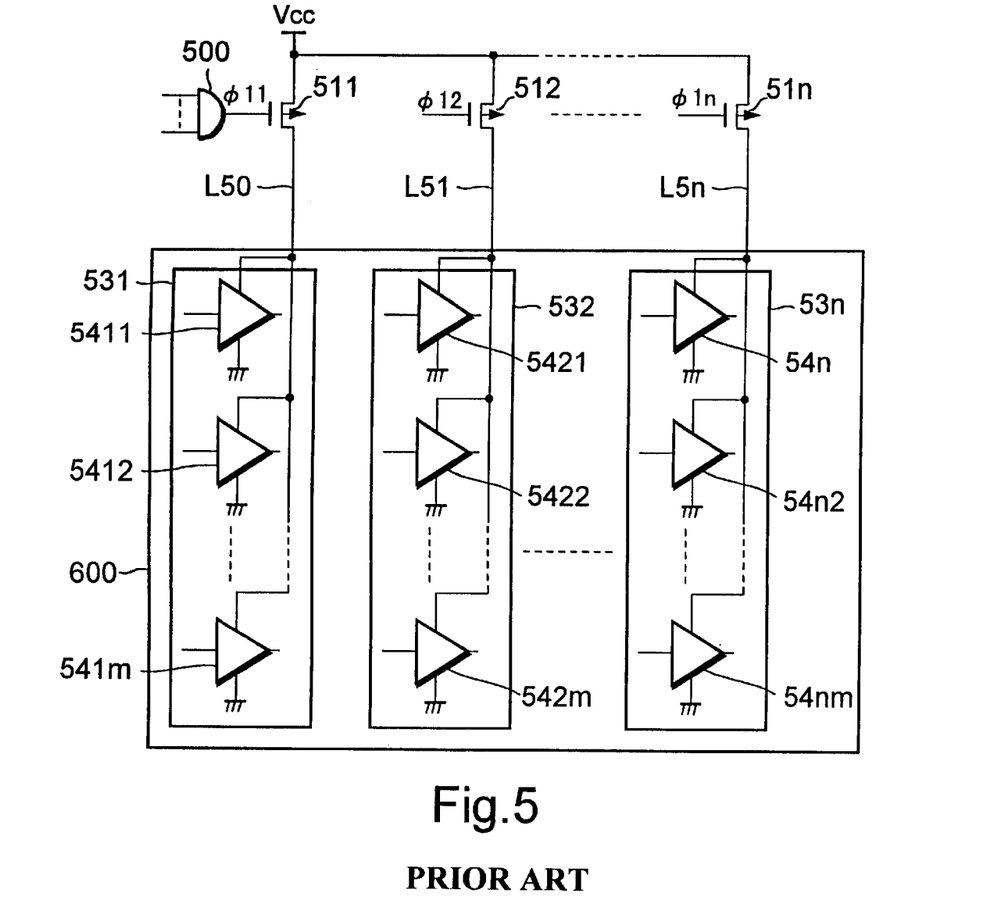
FIG. 5 is a block diagram of a conventional semiconductor integrated circuit.

A semiconductor integrated circuit as shown in FIG. 5 is a selecting circuit of a word line in a dynamic random access memory (DRAM) and is constructed by: a word driver 600; a decoder 500; and n transistors 511, 512, . . . , and 51n for cutting-off the subthreshold current (in the following, abbreviated to cut-off transistors). The word driver 600 is divided into n blocks 531, 532, . . . , and 53n. Each of the blocks is constructed of m driving circuits 5411 to 541m, 5421 to 542m, . . . , and 54n1 to 54nm each constructed of arbitrary logic circuits. Each of the outputs of the driving circuits 5411 to 541m, 5421 to 542m, . . . , and 54n1 to 54nm is connected to each word line of the DRAM. By activating one driving circuit in accordance with input address signals, one word line is selected. Each of the cut-off transistors 511, 512, . . . , and 51n is serially connected between a power source Vcc and each of feed lines L50, L51, . . . , and L5n of the blocks 531, 532, . . . , and 53n of the word driver. The decoder 500 decodes a part of input address signals, sets one of signals Φ1, Φ2, . . . , and Φn to the low level, and sets one of the cut-off transistors 511, 512, . . . , and 51n into a driving state. Thus, a current is supplied to the feed line to which the driving circuit selected in accordance with the input address is connected.

According to the construction, when word driver 600 is inactivated, all of the cut-off transistors 511, 512, . . . , and 51n are turned off, so that no current flows through the feed lines L50, L51, . . . , and L5n. When the word driver 600 is activated, no current is supplied to non-selected blocks 531, 532, . . . , and 53n. Consequently, damage by the subthreshold current can be avoided.

However, in the conventional semiconductor integrated circuit as shown in FIG. 5, in a state where the cut-off transistors 511 to 51n are turned off and the word driver 600 is disconnected from the power source Vcc, there is a case where the subthreshold current flows in the word driver 600 and electric potentials of the feed lines L51 to L5n drop. In such a case, a problem such that the word driver 600 is activated slowly is caused. That is, for instance, in case when the inputted address signals are decoded and the driving circuit 5411 in the word driver 600 is selected, the level of an output Φ1 of the decoder 500 becomes low. The cut-off transistor 511 is then turned on and, first, the feed line L50 is charged. After that, the driving circuit 5411 is operated. As mentioned above, a problem such that even if the decoding signal of the address signal is inputted to the word driver 600, the driving circuit can not be operated promptly is caused.

SUMMARY OF THE INVENTION

It is an object of the invention to provide a semiconductor integrated circuit which can suppress a subthreshold current upon inactivation of a logic gate circuit group in a word driver or the like and can activate the logic gate circuit group at high speed.

A semiconductor integrated circuit of the present invention comprises:
  a first feed line;
  a second feed line;
  a first power source line for applying a first electric potential to the first feed line;
  at least one logic circuit connected between the first feed line and the second feed line and outputting a signal of a predetermined logic level in accordance with a logic level of an input signal;
  a first transistor having a first conductivity and having a current path between the first power source line and the first feed line; and
  a second transistor having the first conductivity and connected in parallel to the first transistor.

The first transistor is in a conductive state when the logic circuit is in an operation state and is in a non-conductive state when the logic circuit is in a standby state.

The second transistor is changed from a non-conductive state to a conductive state before the first transistor is changed from a non-conductive state to a conductive state.

A driving power of the first transistor is larger than that of the second transistor.

Further, a semiconductor integrated circuit of the present invention comprises:
  a semiconductor integrated circuit comprising:
    a memory cell array having a plurality of word lines;
    a first decoder decoding address signals in response to a /RAS signal to output first decoding signals;
    a plurality of feed lines;
    a word driver having a plurality of blocks, each of which has at least one driving circuit, each of the driving circuits being connected with an associated one of the plurality of feed lines, each input terminal of the driving circuits receiving an associated one of the first decode signals and each output terminal of the driving circuits being connected to an associated one of the word lines, and
    a cut-off circuit having a second decoder which decodes a part of the address signals to output second decoding signals, a plurality of first transistors, each of which is serially connected to associated one of the plurality of feed lines, each control electrode of the plurality of first transistors receiving an associated one of the second decoding signals, a plurality of second transistors, each of which is connected in parallel to each of the plurality of first transistors associated with it.

Control electrodes of the plurality of second transistors receive the /RAS signal.

Driving powers of the plurality of first transistors are larger than those of the plurality of second transistors.

According to this construction, when an electric potential of a feed line drops upon standby of a logic circuit by a subthreshold leakage current of the logic circuit, the feed line is charged prior to activation of the logic circuit, so that the activation of the logic circuit can be executed at a high speed.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Figure 1:
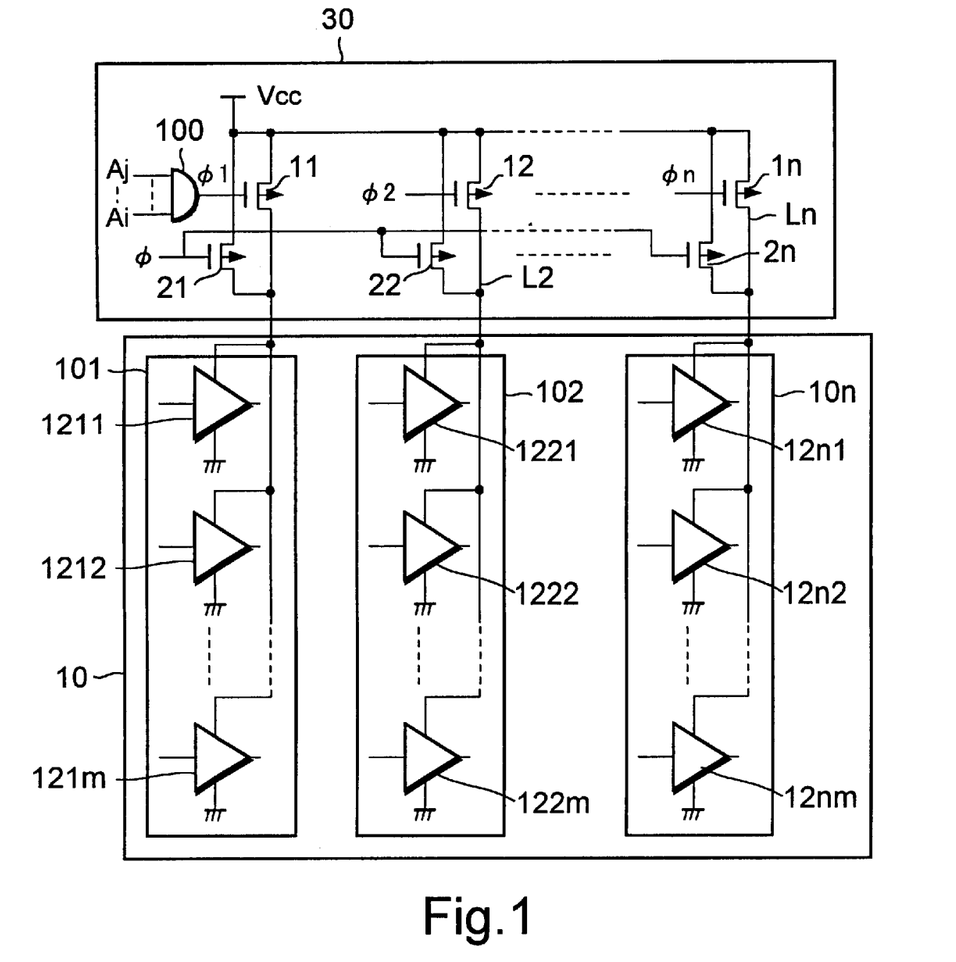
FIG. 1 is a block diagram of the first embodiment of a semiconductor integrated circuit according to the invention.
Figure 6:
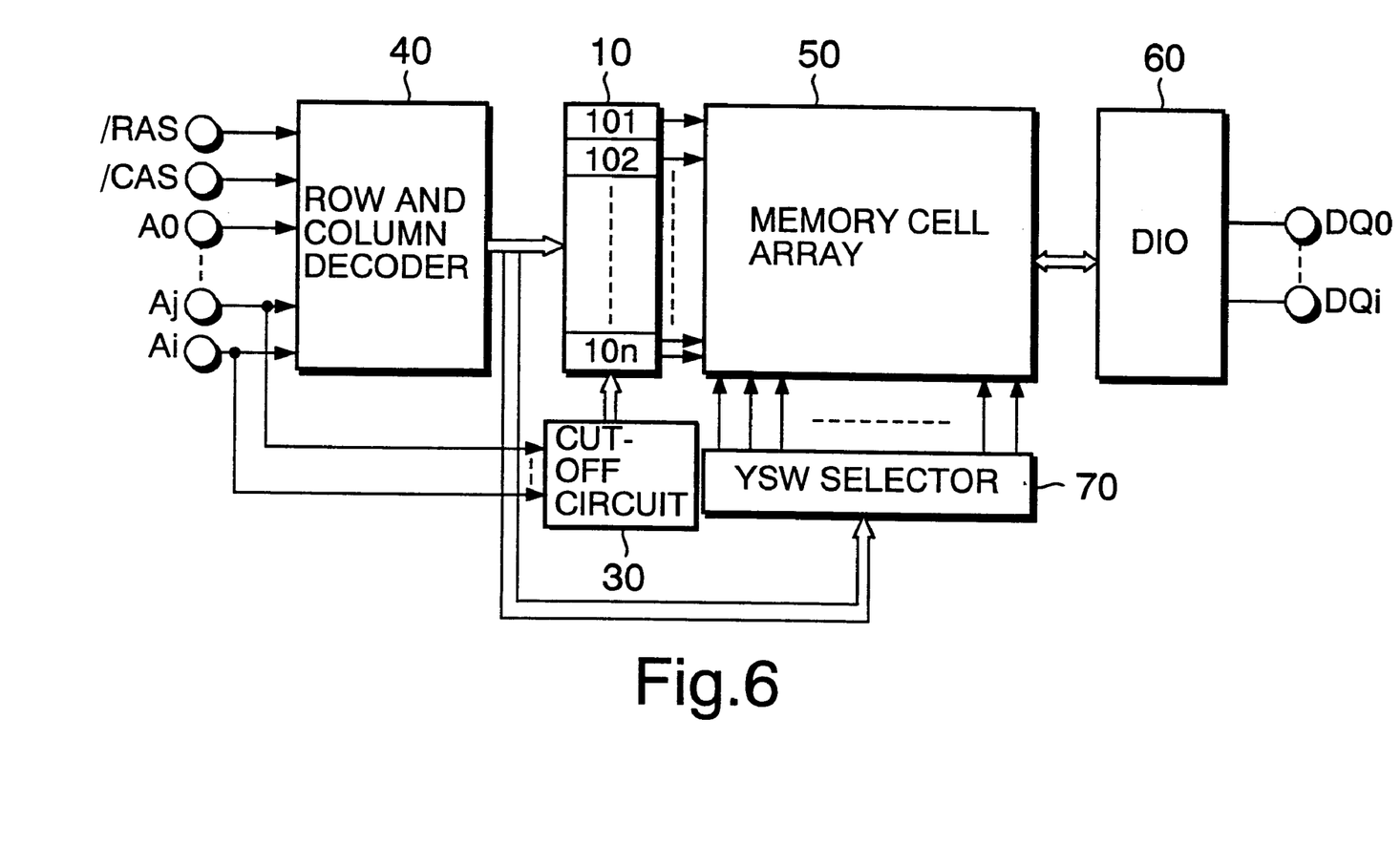
FIG. 6 is a block diagram of a DRAM to which the semiconductor integrated circuit according to the invention is applied.

A semiconductor integrated circuit according to the first embodiment of the present invention is applied as a selecting circuit of a word line of a dynamic random access memory (DRAM) and, as shown in FIG. 1, has a word driver 10 and a cut-off circuit 30. FIG. 6 shows a block diagram of the DRAM to which a circuit shown in FIG. 1 is applied. A /RAS signal, a /CAS signal, and address signals A0 to Ai are inputted to a row and column decoder 40. In response to the /RAS signal, signals which are obtained by decoding the address signals A0 to Ai are outputted to the word driver 10. In response to the /CAS signal, the decoding signals are outputted to a YSW selector 70. A cut-off circuit 30 decodes a part (here, corresponding to signals Aj to Ai) of the address signals A0 to Ai, so that a current is supplied to one of blocks 101 to 10n of the word driver 10. A memory cell array 50 outputs data stored in a selected memory cell to input/output terminals DQ0 to DQi via a DIO 60, or stores inputted data to the selected memory cell.

The word driver 10 is divided into n blocks 101, 102, ..., and 10n. Each of the blocks is constructed by each of m driving circuits 1211 to 121m, 1221 to 122m, ..., and 12n1 to 12nm which comprise an arbitrary logic circuit. Each of the outputs of the driving circuits 1211 to 121m, 1221 to 122m, ..., and 12n1 to 12nm is connected to a plurality of word lines in the memory cell array 50. Activation of one of driving circuits in accordance with the input addresses A0 to Ai results in selecting one of the word lines. The driving circuits 1211 to 121m, 1221 to 122m, ..., and 12n1 to 12nm comprise, for example, a NOT circuit, NAND circuit, or the like, respectively.

The cut-off circuit 30 comprises a decoder 100; n cut-off pMOS transistors 11, 12, ..., and 1n, each of which is driven by each of decoding signals Φ1, Φ2, ..., and Φn of the decoder 100, and one end of each of which is connected to a power source and the other ends of which are connected to the word driver 10; and n PMOS transistors 21, 22, ..., and 2n, each of which is connected in parallel to each of the cut-off pMOS transistors 11, 12, ..., and 1n, and are driven by a signal Φ.

An operation of the semiconductor integrated circuit of this embodiment will now be described with reference to FIGS. 1, 6, and 2 in the following.

First, when the word driver 10 as shown in FIG. 1 does not output, that is, in case of standby of the operation of the word driver 10, all of the driving circuits in the word driver 10 and cut-off PMOS transistors 11, 12, ..., and in and pMOS transistors 21, 22, ..., and 2n are turned off. Therefore, increase in consumption of an electric power by the subthreshold current upon standby of the operation can be prevented.

Subsequently, operation time of the word driver 10 will be described.

Figure 2:
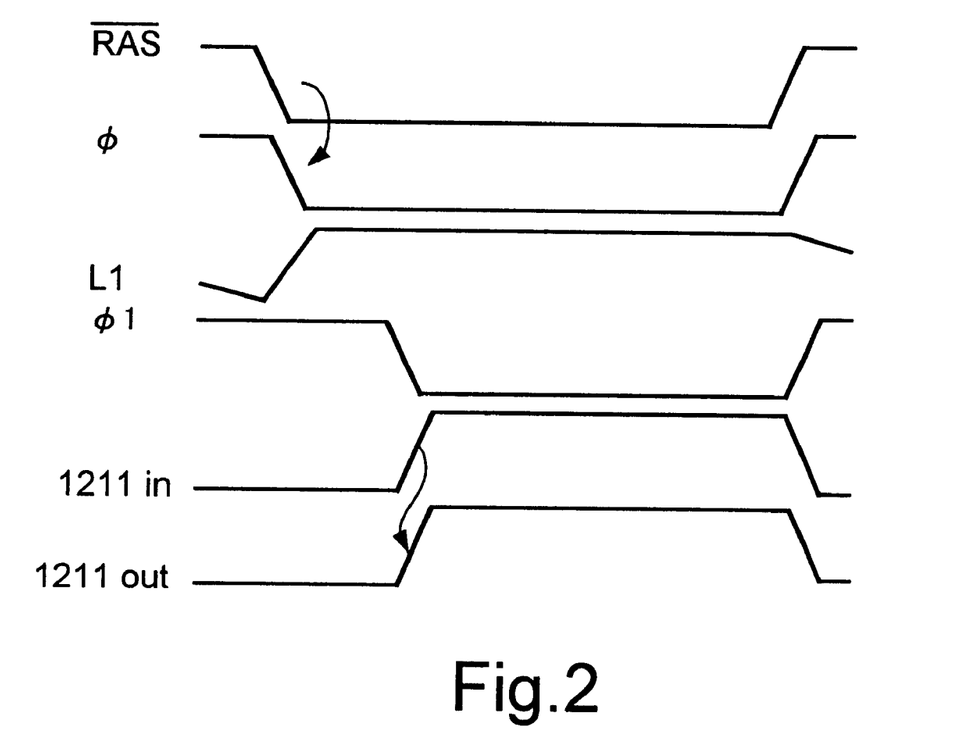
FIG. 2 is a timing chart showing an operation of the semiconductor integrated circuit as shown in FIG. 1.

FIG. 2 shows a timing chart in case where the address signals A0 to Ai are decoded, so that the driving circuit 1211 in the block 101 of the word driver 10 is selected.

Since, in standby of the operation, the cut-off pMOS transistors 11 to in are turned off as mentioned above and the word driver 10 is disconnected from a power source Vcc, there is a chance that electric potentials of feed lines L1 to Ln drop by a subthreshold current of the word driver 10. FIG. 2 shows such a case and the electric potential of the feed line L1 is decreased upon standby of the operation. When the /RAS signal is activated from such a state, in response to that, the signal Φ is set to the low level. Thus, the transistors 21 to 2n as shown in FIG. 1 are turned on and the feed lines L1 to Ln are charged. That is, the electric potentials of the feed lines L1 to Ln are preliminarily increased. In FIG. 2, the electric potentials of the feed lines L2 to Ln are omitted.

After that, a part (Aj to Ai) of the input addresses are decoded by the decoder 100 and the decoding signal Φ1 is set to the low level. The input addresses A0 to Ai are decoded by a decoder 40 and an input signal $1211_{in}$ of the driving circuit 1211 is set to the high level. Thus, an output signal $1211_{out}$ is outputted and one of the word lines in the memory cell array 50 is selected. In this instance, according to the embodiment, since the feed lines L1 to Ln are preliminarily charged before the decoding signal from the decoder 40 is inputted to the word driver 10, the driving circuit 1211 can output the output signal $1211_{out}$ promptly after the decoding signal $1211_{in}$ was inputted.

Timings of transition of the decoding signal Φ1 and transition of the signal $1211_{in}$ are delayed from transition of the /RAS signal for a predetermined period by delay of the cut-off circuit 30 and decoder 40. Consequently, the signal Φ to drive the transistors 21 to 2n is set to a signal which synchronizes with the transition of the /RAS, so that, as mentioned above, the feed lines L1 to Ln can be preliminarily charged.

Since the pMOS transistors 21, 22, ..., and 2n shown in FIG. 1 function in order to charge the feed lines L1 to Ln, it is preferable that transistors having a small driving power are used. By such transistors, consumption of the electric power is suppressed as much as possible and an operation at a high speed can be realized.

It is preferable that the cut-off pMOS transistors 11, 12, . . . , and 1n have a large driving power so as to drive the word driver 10.

As mentioned above, in the first embodiment of the semiconductor integrated circuit according to the invention as shown in FIG. 1, even if the electric potentials of the feed lines L1, L2, . . . , and Ln decrease by the subthreshold current of the word driver 10, prior to inputting of the decoding signal, the pMOS transistors 21, 22, . . . , and 2n are turned on, so that the feed lines L1, L2, . . . , and Ln can be pre-charged (those electric potentials can be increased) and the operation after that can be performed at a high speed.

Next, the second embodiment of the semiconductor integrated circuit of the invention will be now described with reference to FIGS. 3, 4 and 6.

The semiconductor integrated circuit according to the second embodiment is applied as a selecting circuit of a word line of a dynamic random access memory (DRAM) similarly with the first embodiment. As shown in FIG. 3, the semiconductor integrated circuit has the word driver 10 and cut-off circuit 30. In the embodiment, different from the first embodiment, the cut-off circuit 30 further has cut-off nMOS transistors 381, 382, . . . , and 38n for cutting off the subthreshold current which are provided for n grounding lines S1, S2, . . . , and Sn of the word driver 10. Each of the cut-off nMOS transistors 381, 382, . . . , and 38n is controlled by each of signals Φ1', Φ2', . . . , and Φn'which is obtained by inverting each of the decoding signals Φ1, Φ2, . . . , and Φn outputted from the decoder 100 by an NOT (inverter) 365.

Further, the cut-off circuit 30 has nMOS transistors 371, 372, . . . , and 37n, each of which is connected in parallel to each of the cut-off nMOS transistors 381, 382, . . . , and 38n. Those transistors can be driven by the signal Φ'.

Similarly with the first embodiment, the word driver 10 is divided into n blocks 101, 102, . . . , and 10n. Each of the blocks is constructed of m driving circuits 3211 to 321m, 3221 to 322m, . . . , and 32n1 to 32nm each constructed by an arbitrary logic circuit. Each of the outputs of the driving circuits 3211 to 321m, 3221 to 322m, . . . , and 32n1 to 32nm is connected to a plurality of word lines in the memory cell array 50, respectively. In response to the input address signals A0 to Ai, one of the driving circuits is activated, so that one of the plurality of word lines is selected. Each of the driving circuits 3211 to 321m, 3221 to 322m, . . . , and 32n1 to 32nm according to the embodiment is constructed by two inverters 351 and 361 as shown in FIG. 3.

An operation of the semiconductor integrated circuit of the embodiment will now be described in the following.

Figure 3:
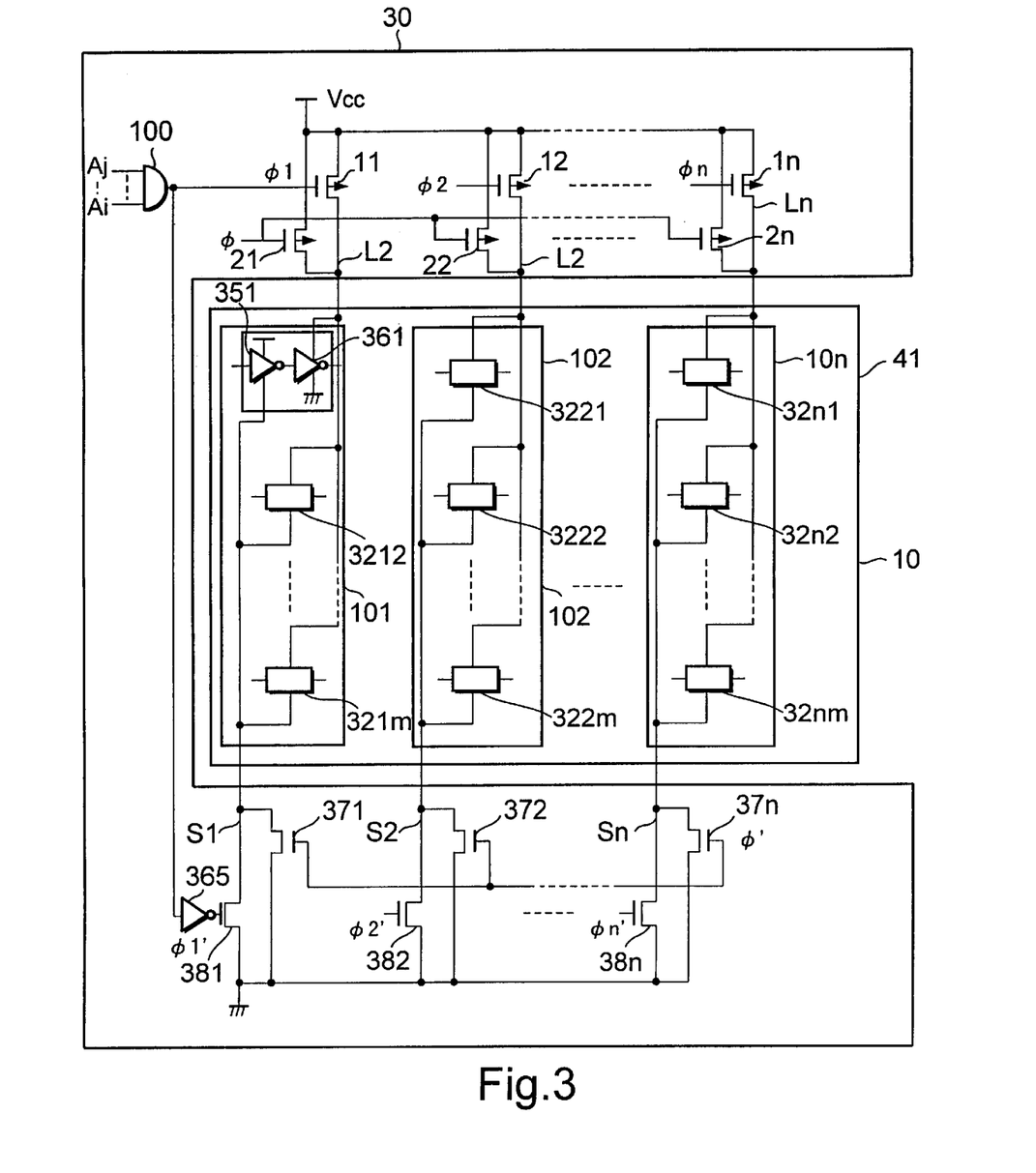
FIG. 3 is a block diagram of the second embodiment of the semiconductor integrated circuit according to the invention.

First, if the word driver 10 as shown in FIG. 3 does not output, that is, in case of standby of the operation of the word driver 10, all of the driving circuits in the word driver 10 and cut-off pMOS transistors 11, 12, . . . , and 1n and pMOS transistors 21, 22, . . . , and 2n and cut-off nMOS transistors 381, 382, . . . , and 38n and nMOS transistors 371, 372, . . . , and 37n are turned off. Therefore, increase in consumption of an electric power by the subthreshold current upon standby of the operation can be prevented.

Next, operation timing of the word driver 10 will be described.

Figure 4:
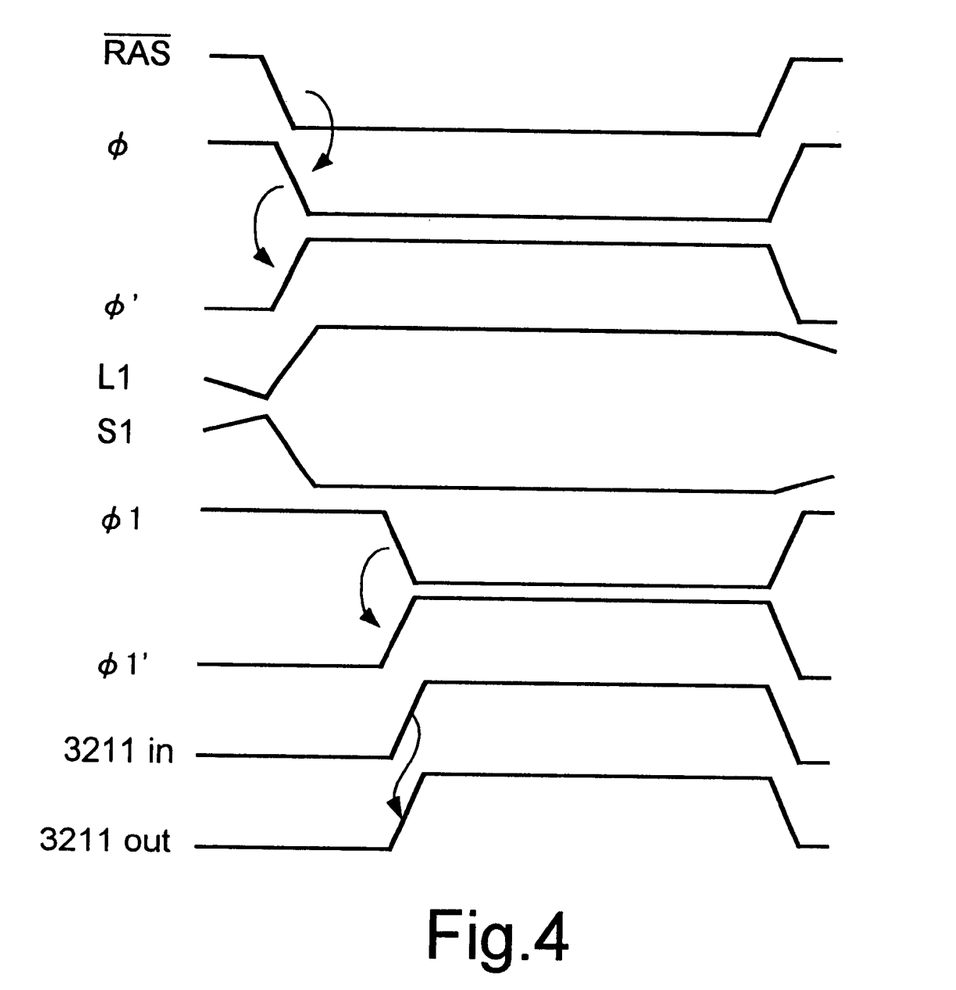
FIG. 4 is a timing chart showing an operation of the semiconductor integrated circuit as shown in FIG. 3.

FIG. 4 shows a timing chart in case where the address signals A0 to Ai are decoded, so that the driving circuit 3211 in the block 101 of the word driver 10 is selected.

Since, on standby of the operation, the cut-off pMOS transistors 11 to 1n are turned off as mentioned above and the word driver 10 is disconnected from the power source Vcc, there is a chance that electric potentials of the feed lines L1 to Ln drop by the subthreshold current of the word driver 10. Since the cut-off nMOS transistors 381, 382, . . . , and 38n are also turned off and the word driver 10 is disconnected from the grounding power source as well, there is a chance that the electric potentials of the grounding lines S1 to Sn are increased by the subthreshold current.

FIG. 4 shows such a state and the electric potential of the feed line L1 drops upon standby of the operation and the electric potential of the grounding line S1 increases. When the /RAS signal is active from such a state, in response to this state, the signal Φ is set to the low level. Thus, the transistors 21 to 2n as shown in FIG. 3 are turned on and the feed lines L1 to Ln are charged. That is, the electric potentials of the feed lines L1 to Ln are preliminarily increased and, in response to the signal Φ. Further,in response to the signal Φ, the transistors 371 to 37n are turned on and the grounding lines S1 to Sn are discharged. That is, the electric potentials of the grounding lines are preliminarily decreased. In FIG. 4, the electric potentials of the feed lines L2 to Ln and the grounding lines S2 to Sn are omitted.

After that, the decoder 100 decodes a part (Aj to Ai) of the input address signals and the decoding signal Φ1 is set to the low level. The input address signals A0 to Ai are decoded by the decoder 40 and an input $3211_{in}$ of the driving circuit 3211 is set to the high level. Thus, a signal $3211_{out}$ is outputted and one of the word lines in the memory cell array 50 is selected. In this instance, according to this embodiment, since the feed lines L1 to Ln are preliminarily charged before the decoding signal from the decoder 40 is inputted to the word driver 10 and the grounding lines S1 to Sn are discharged, the driving circuit 3211 can output the output signal $3211_{out}$ promptly in response to the input of the decoding signal $3211_{in}$.

As mentioned above, in the second embodiment of the semiconductor integrated circuit according to the invention as shown in FIG. 3 as well, an effect similar to that of the first embodiment as shown in FIG. 1 can be obtained. Further, each of the nMOS transistors 371 to 37n is connected in parallel to, each of the cut-off nMOS transistors 381 to 38n serving as transistors for cutting-off the subthreshold current, respectively, which is serially connected to each of the grounding lines of the word driver 10. Therefore, if the word driver 10 is operated, prior to start of the operation, the electric potentials of the grounding lines S1, S2, . . . , and Sn can be decreased, so that the word driver 10 can be activated more promptly.

In the first embodiment, a case where each of the pMOS transistors 21 to 2n is connected in parallel to each of the cut-off PMOS transistors 11 to in which is serially connected to each of the feed lines of the word driver 10 has been described. In the second embodiment, a case where each of transistors 21 to 2n is connected in parallel to each of the cut-off pMOS transistors 11 to 1n which is serially connected to each of the feed lines of the word driver 10. Each of the nMOS transistors 371 to 37n is connected in parallel to each of the cut-off nMOS transistors 381 to 38n which is serially connected to each of the grounding lines of a logic gate circuit group 41 has been described. This invention, however, is not limited to the foregoing embodiments and various modifications can be embodied without departing from the scope of the invention.

For example, as shown in the second embodiment, transistors can be provided for the grounding lines of the word driver 10 instead of providing transistors for both of the feed lines and the grounding lines of the word driver 10. That is, an embodiment such that each of the nMOS transistors is connected in parallel to only each of the cut-off nMOS transistors which is serially connected to each of the grounding lines of the word driver 10 is possible.

The logic circuit comprising the word driver 10, which is provided by the foregoing first and second embodiments, can be constructed by properly combining not only the NOT or NAND circuits but also NOR, AND, OR, or the like cicuits.

In the foregoing first and second embodiments, signals as signals Φ and Φ' inputted to gates of the PMOS transistors 21 to 2n and nMOS transistors 371 to 37n are not especially limited. However, as a signal Φ, the /RAS signal can be directly used and, as a signal Φ, an inverting signal of the /RAS signal can be used. Further, inversely, that is, as a signal Φ, an inverting signal of the address signal RAS can be used and, as a signal Φ, the /RAS signal can be directly used. In those cases, timings when the pMOS transistors 21 to 2n and nMOS transistors 371 to 37n are turned on become further rapid and the word driver 10 can be activated further rapidly.

Moreover, the invention is not limited to a case where it is applied to a word driver serving as a selecting circuit of a word line in a dynamic random access memory (DRAM) and can be applied to other various circuits.

As will be obviously understood, according to the present invention, in a semiconductor integrated circuit having a logic gate circuit group comprising a plurality of logic gate circuits, when the feed lines (grounding lines) to supply electric potentials to the plurality of logic gate circuits are voltage-decreased (increased) by a subthreshold leakage current, transistors such that prior to activating the circuit, the feed lines are preliminarily charged (discharged) and the electric potentials are decreased (increased) are added, so that a semiconductor integrated circuit which enables the logic gate circuit group to be activated at a high speed can be provided.

It is apparent that the present invention is not limited to the above embodiments, but may be modified and changed without departing from the scope and spirit of the invention.

What is claimed is:

1. A semiconductor integrated circuit comprising:
    a first feed line;
    a second feed line;
    a first power source line for applying a first electric potential to said first feed line;
    at least one logic circuit connected between said first feed line and said second feed line and outputting a signal having a predetermined logic level in accordance with a logic level of an input signal;
    a first transistor having a first conductivity type and having a current path between said first power source line and said first feed line;
    a second transistor having said first conductivity type and connected in parallel to said first transistor; and
    a decoder receiving a first address signal in response to a predetermined signal and outputting a decoding signal, wherein said second transistor is changed from a non-conductive state to a conductive state in response to said predetermined signal, and said first transistor is changed from a non-conductive state to a conductive state in response to said decoding signal,
    wherein a signal for driving said second transistor is set to a signal which synchronizes with a transition of said predetermined signal, such that said first and second feed lines are preliminarily charged.

2. The semiconductor integrated circuit according to claim 1, wherein a driving power of said first transistor is larger than that of said second transistor.

3. The semiconductor integrated circuit according to claim 1, further comprising:
    a second power source line for applying a second electric potential to said second feed line;
    a third transistor having a current path between said second power source line and said second feed line; and
    a fourth transistor connected in parallel to said third transistor.

4. The semiconductor integrated circuit according to claim 3, wherein said fourth transistor is changed from a non-conductive state to a conductive state in response to said predetermined signal and said third transistor is changed from a conductive state to a non-conductive state in response to said decoding signal.

5. The semiconductor integrated circuit according to claim 3, wherein a driving power of said third transistor is larger than that of said fourth transistor.

6. The semiconductor integrated circuit according to claim 3, wherein said first and second transistors comprise p-channel type MOS transistors and said third and forth transistors comprise n-channel type MOS transistors.

7. The semiconductor integrated circuit according to claim 1, further comprising:
    a row and column decoder receiving a second address signal in response to said predetermined signal and outputting a select signal to said at least one logic circuit.

8. The semiconductor integrated circuit according to claim 7, wherein said first address signal comprises a part of said second address signal.

9. The semiconductor integrated circuit according to claim 1, wherein said second transistor is activated prior to activation of said at least one logic circuit and the first transistor.

10. The semiconductor integrated circuit according to claim 1, wherein said predetermined signal comprises a /RAS signal.

11. The semiconductor integrated circuit according to claim 1, wherein said feed lines are preliminarily charged prior to said decoding signal from said decoder being acted upon by said first transistor.

12. A semiconductor integrated circuit comprising:
    a first feed line;
    a second feed line;
    a first power source line for applying a first electric potential to said first feed line;
    at least one logic circuit connected between said first feed line and said second feed line and outputting a signal having a predetermined logic level in accordance with a logic level of an input signal;
    a first transistor and having a current path between said first power source line and said first feed line;
    a second transistor connected in parallel to said first transistor; and
    a decoder receiving a first address signal in response to a predetermined signal and outputting a decoding signal, wherein a signal for driving said second transistor is set to a signal which synchronizes with a transition of said predetermined signal, such that said first and second feed lines are preliminarily charged.

13. The semiconductor integrated circuit according to claim 12, wherein said second transistor is changed from a non-conductive state to a conductive state in response to said predetermined signal, and said first transistor is changed from a non-conductive state to a conductive state in response to said decoding signal.

14. The semiconductor integrated circuit according to claim 12, wherein a driving power of said first transistor is larger than that of said second transistor.

15. The semiconductor integrated circuit according to claim 12, further comprising:
 a second power source line for applying a second electric potential to said second feed line;
 a third transistor having a current path between said second power source line and said second feed line; and
 a fourth transistor connected in parallel to said third transistor.

16. The semiconductor circuit according to claim 15, wherein said first and second transistors have a same conductivity type, and said third and fourth transistors have a second conductivity type.

17. The semiconductor integrated circuit according to claim 12, wherein said feed lines are preliminarily charged prior to said decoding signal from said decoder being acted upon by said first transistor.

* * * * *